US007236507B2

(12) United States Patent
Stewart et al.

(10) Patent No.: US 7,236,507 B2
(45) Date of Patent: Jun. 26, 2007

(54) TIME-BASED ADJUSTMENT OF TEMPERATURE CONTROL OF LASER TO STABILIZE WAVELENGTHS

(75) Inventors: James Stewart, San Jose, CA (US); Lucy G. Hosking, Santa Cruz, CA (US)

(73) Assignee: Finisar Corporation, Sunnyvale, CA (US)

( * ) Notice: Subject to any disclaimer, the term of this patent is extended or adjusted under 35 U.S.C. 154(b) by 133 days.

(21) Appl. No.: 10/783,560

(22) Filed: Feb. 20, 2004

(65) Prior Publication Data

US 2004/0161248 A1    Aug. 19, 2004

Related U.S. Application Data

(63) Continuation-in-part of application No. 10/700,981, filed on Nov. 4, 2003, now Pat. No. 7,058,099.

(60) Provisional application No. 60/425,031, filed on Nov. 8, 2002.

(51) Int. Cl.
*H01S 3/04* (2006.01)
*H01S 3/08* (2006.01)
(52) U.S. Cl. .............................. 372/34; 372/32; 372/36
(58) Field of Classification Search ............ 372/34–36, 372/18, 32–26; 385/12; 398/85, 79, 95, 398/196
See application file for complete search history.

(56) References Cited

U.S. PATENT DOCUMENTS

| 4,359,553 A | 11/1982 | Edwards |
| 4,378,451 A | 3/1983 | Edwards |
| 4,631,728 A | 12/1986 | Simons et al. |
| 5,019,769 A | 5/1991 | Levinson et al. |
| 5,024,535 A | 6/1991 | Winston, Jr. et al. |
| 5,041,491 A | 8/1991 | Turke et al. |
| 5,281,516 A | 1/1994 | Stapleton et al. |
| 5,516,563 A | 5/1996 | Schumann et al. |
| 5,604,758 A | 2/1997 | AuYeung et al. |
| 6,055,252 A | 4/2000 | Zhang |
| 6,291,813 B1* | 9/2001 | Ackerman et al. ...... 250/214 R |
| 6,331,991 B1* | 12/2001 | Mahgerefteh ................ 372/33 |
| 6,353,623 B1* | 3/2002 | Munks et al. ................. 372/20 |

(Continued)

OTHER PUBLICATIONS

"4-Channel Temperature Tunable 40 mW CW DFB Laser with Locker CQF474/708 Series." JDS Uniphase Product Bulletin. www.jdsu.com. 3 pgs., no month, day, year.

(Continued)

*Primary Examiner*—Don Wong
*Assistant Examiner*—Hung Tran Vy
(74) *Attorney, Agent, or Firm*—Workman Nydegger

(57) ABSTRACT

Method and apparatuses for compensating for wavelength drift in a fiber-optic laser transmitter includes 1) controlling a temperature within the optoelectronic assembly at a defined level; 2) driving the optoelectronic assembly to emit light, wherein the emitted light has a wavelength that is within a channel of operation, the channel of operation including a range of wavelengths centered around a channel center wavelength; 3) accessing from memory within the optoelectronic assembly a control value associated with the temperature of the optoelectronic assembly at defined points within an operational lifetime of the optoelectronic assembly; and 4) recalculating the defined level by reference to the control value, whereby a wavelength of the optoelectronic assembly is maintained within the channel of operation despite an expected drift of wavelength.

19 Claims, 13 Drawing Sheets

U.S. PATENT DOCUMENTS

| | | |
|---|---|---|
| 6,400,737 B1 | 6/2002 | Broutin et al. |
| 6,549,687 B1 * | 4/2003 | Kochergin et al. ............ 385/12 |
| 6,807,208 B2 * | 10/2004 | Nasu et al. .................... 372/36 |
| 6,822,986 B2 * | 11/2004 | Nasu et al. .................... 372/32 |
| 6,836,578 B2 * | 12/2004 | Kochergin et al. ............ 385/12 |
| 6,856,633 B2 * | 2/2005 | Nasu et al. .................... 372/34 |
| 6,980,742 B1 * | 12/2005 | Liden et al. ................... 398/85 |
| 2003/0067949 A1 * | 4/2003 | Nasu et al. .................... 372/32 |
| 2003/0152390 A1 | 8/2003 | Stewart et al. |
| 2004/0114646 A1 | 6/2004 | Stewart et al. |
| 2005/0018720 A1 * | 1/2005 | Kish et al. .................... 372/20 |

OTHER PUBLICATIONS

"SFF-8053 Specification for GBIC (Gigabit Interface Converter)." SFF Committee. Sep. 27, 2000. www.schelto.com/t11_2/GBIC/sff-8053.pdf. 82 pgs.

"Small Form-factor Pluggable (SFP) Transceiver MulitSource Agreement (MSA)." www.schelto.com/SFP/SFP%20MSA.pdf. Sep. 14, 2000 38 pgs.

* cited by examiner

Channel Lookup
Table
1000

| channel | temperature | $I_{laser\ bias}$ | AC modulation |
|---|---|---|---|
| 1 | 43 C | 0.5 A | 1.5 |
| 2 | 34 C | 0.55 A | 1.1 |
| . | . | . | . |
| . | . | . | . |
| . | . | . | . |
| . | . | . | . |
| . | . | . | . |
| . | . | . | . |

Wavelength drift lookup table 1200

| time | temperature | $I_{laser\ bias}$ |
|---|---|---|
| $t_1$ | 43 C | 0.5 A |
| $t_2$ | 42 C | 0.55 A |
| ⋮ | ⋮ | ⋮ |

Fig. 12A

Wavelength drift lookup table 1210

| channel | time | temperature | $I_{laser\ bias}$ |
|---|---|---|---|
| 1 | $t_1$ | 43 C | 0.5 A |
| 1 | $t_2$ | 42 C | 0.55 A |
| ⋮ | ⋮ | ⋮ | ⋮ |
| 2 | $t_a$ | 41 C | 0.5 A |
| 2 | $t_b$ | 40 C | 0.55 A |
| ⋮ | ⋮ | ⋮ | ⋮ |

Fig. 12B

TIME-BASED ADJUSTMENT OF TEMPERATURE CONTROL OF LASER TO STABILIZE WAVELENGTHS

CROSS-REFERENCE TO RELATED APPLICATIONS

This application is a continuation-in-part of U.S. patent application Ser. No. 10/700,981, filed on Nov. 4, 2003 now U.S. Pat. No. 7,058,099 and entitled "Age Compensation in Optoelectronic Modules with Integrated Temperature Control", which claims the benefit to U.S. Provisional Patent Application Ser. No. 60/425,031, filed Nov. 8, 2002, both applications of which are incorporated herein by reference.

BACKGROUND OF THE INVENTION

1. The Field of the Invention

The present invention relates generally to optoelectronic components. More particularly, the present invention relates to method for compensating for wavelength drift in a fiber-optic laser transmitter.

2. Background and Relevant Art

The proliferation of communication technologies creates every day increases in demand for data transfer channels. Optical networks are a highly-reliable and efficient way to satisfy this demand. As a result, there is a desire to achieve higher data throughput in existing optical networks. A current means for satisfying this desire is the use of Dense Wave Division Multiplexing (DWDM). As shown in FIG. 1, DWDM data from a plurality of sources is converted into optical signals 2 with different wavelengths by a plurality of optoelectronic transceivers 4. After being multiplexed by an optical multiplexer/demultiplexer 6, optical signals 2 may pass through a single optical cable 8 simultaneously, which greatly increases network throughput.

There are several standards for a signal traveling through an optical network. These standards specify acceptable wavelengths of a signal (channel) and the "distance" or spacing between neighboring channels. There exists a need, therefore, for optoelectronic transceivers capable of operating on specific wavelengths. Currently, the most popular standards are 200 GHz (gigahertz) spacing, which is equivalent to 1.6 nm (nanometers) spacing between neighboring channels, 100 GHz, equivalent to 0.8 nm spacing, 50 GHz, equivalent to 0.4 nm spacing, and 25 GHz equivalent to 0.2 nm spacing between channels. As described herein, the term "distance" in reference to channels refers primarily to the distance in frequency (Hz) or wavelength between channels in a spectrum, commonly one or more nanometers, rather than physical distance traveled, such as one or more miles, etc. The specific wavelengths (i.e., channels) acceptable for data transfer in an optical network are proscribed by the International Telecommunications Union (ITU).

Optical amplifiers, used to increase the strength of an optical signal before it enters an optical network, typically have an optimal operational wavelength range. For modern Ebrium-Doped Fiber Amplifiers (EDFA) the typical operational wavelength range is 1523 to 1565 nm. If the network is using a 200 GHz standard for channel spacing, the number of available channels is 22. For 100 GHz standard the number of channels is 45; for 50 GHz—90 channels; for 25 GHz standard—180 channels.

FIG. 2 shows a schematic representation of wavelength intervals when the channel spacing standard is 100 GHz. The distance between neighboring channel centers 10 is 0.8 nm. For a signal to stay within the allowed pass band 14 its wavelength must be within 0.1 nm of the center of the specified channel. Operation outside the allowable allowed pass band 14 results in high attenuation of the transmitted signal, and in some cases, potential cross-talk with an adjacent channel.

Unfortunately, the wavelengths of lasers tend to change over time for various reasons. The wavelength emitted by the laser may shift, for example, as the laser emitter ages or as the laser temperature increases. In order to calculate how much the laser emitter wavelength can shift before it starts encroaching on a neighboring channel, several parameters of laser emitter calibration are be taken into account.

When calculating the allowable pass band of a laser emitter, an allowance must be made for an initial setup tolerance 16 (FIG. 3) and temperature control tolerance 18. For example, for a part in which the initial wavelength is targeted at the center channel, and with a set-up tolerance of +/−10 pm (picometers), and a temperature control tolerance of +/−20 pm, for a combined set-up and temperature control tolerance of +/−30 pm. Based on these tolerances and a 100 pm maximum total wavelength offset tolerance, the allowable wavelength aging is +/−70 pm over the life of the part.

There are several factors determining the wavelength of a signal produced by traditional laser sources. These factors include current density, temperature of the laser emitter, as well as specific inherent characteristics of the laser emitter. The relationship between the temperature of the laser emitter and the wavelength produced is typically around 0.1 nm/° C. for Distributed Feedback ("DFB") sources that are commonly used in DWDM applications. This means that if the laser emitter temperature is increased by 10° C., the wavelength of the emitted light will shift about +1 nm.

Since the wavelength produced by a transceiver at a specified laser emitter temperature and current density differs from one laser emitter to the other, the optoelectronic transceivers are initially calibrated before being installed in an optical network. The calibration includes monitoring the wavelength of optical signals produced by the laser emitter while varying its temperature as well as other operating conditions, and then storing calibration information in the memory of a microprocessor. It also includes receiving analog signals from sensors in the optoelectronic device and converting the analog signals into digital values, which are also stored in the memory. As a result the device generates control signals based on the digital values in the microprocessor to control the temperature of the laser emitter. The method of calibrating an optoelectronic transceiver is described in detail in a U.S. patent application entitled "Control Circuit for Optoelectronic Module with Integrated Temperature Control," identified by Ser. No. 10/101,248, and filed on Mar. 18, 2002, which is incorporated herein by reference.

For performance and reliability reasons, it is desirable to operate a laser emitter at a temperature between 15° C. and 50° C. There are several factors limiting the acceptable range of operating temperatures. First, a laser emitter ages more rapidly when operated at temperatures above 50° C., and may cause reliability concerns at typical end of life conditions (20–25 years). The quantum efficiency of the laser emitter decreases with age and, therefore, forces the transceiver to operate at higher currents in order to provide a fixed optical power, which further accelerates the aging of the laser emitter. In addition, temperature performance characteristics of the device used to control the laser temperature determine the lower limit of the available range of temperatures. A well-designed thermal system using a single stage thermo-electric cooler (TEC) as a temperature control device can typically provide up to 40° C. cooling. Since the standard maximum operating temperature of a transceiver is 70° C., the 40° C. cooling capability of the TEC means that the effective operating range of the laser emitter in the transceiver is restricted to temperatures between 30° C. and 50° C.

Finally, persons skilled in the art recognize that the wavelength of a laser diode varies during its operational lifetime. As a result, steps need to be taken in order to ensure that the wavelength does not drift outside of a selected channel during this operational lifetime. Prior art techniques for preventing this drift include the use of wavelength lockers, which are expensive and of questionable reliability.

BRIEF SUMMARY OF THE INVENTION

A method of operating an optoelectronic assembly includes 1) controlling a temperature within the optoelectronic assembly at a defined level; 2) driving the optoelectronic assembly to emit light, wherein the emitted light has a wavelength that is within a channel of operation, the channel of operation including a range of wavelengths centered around a channel center wavelength; 3) accessing from memory within the optoelectronic assembly a control value associated with the temperature of the optoelectronic assembly at defined points within an operational lifetime of the optoelectronic assembly; and 4) recalculating the defined level by reference to the control value, whereby a wavelength of the optoelectronic assembly is maintained within the channel of operation despite an expected drift of wavelength.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIGS. 12A and 12B illustrate wavelength drift lookup tables.

DETAILED DESCRIPTION OF THE PREFERRED EMBODIMENTS

A number of embodiments of the invention are described below. In the interest of clarity, not all features of an actual implementation are described. It will be appreciated that in the development of any such embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 4:
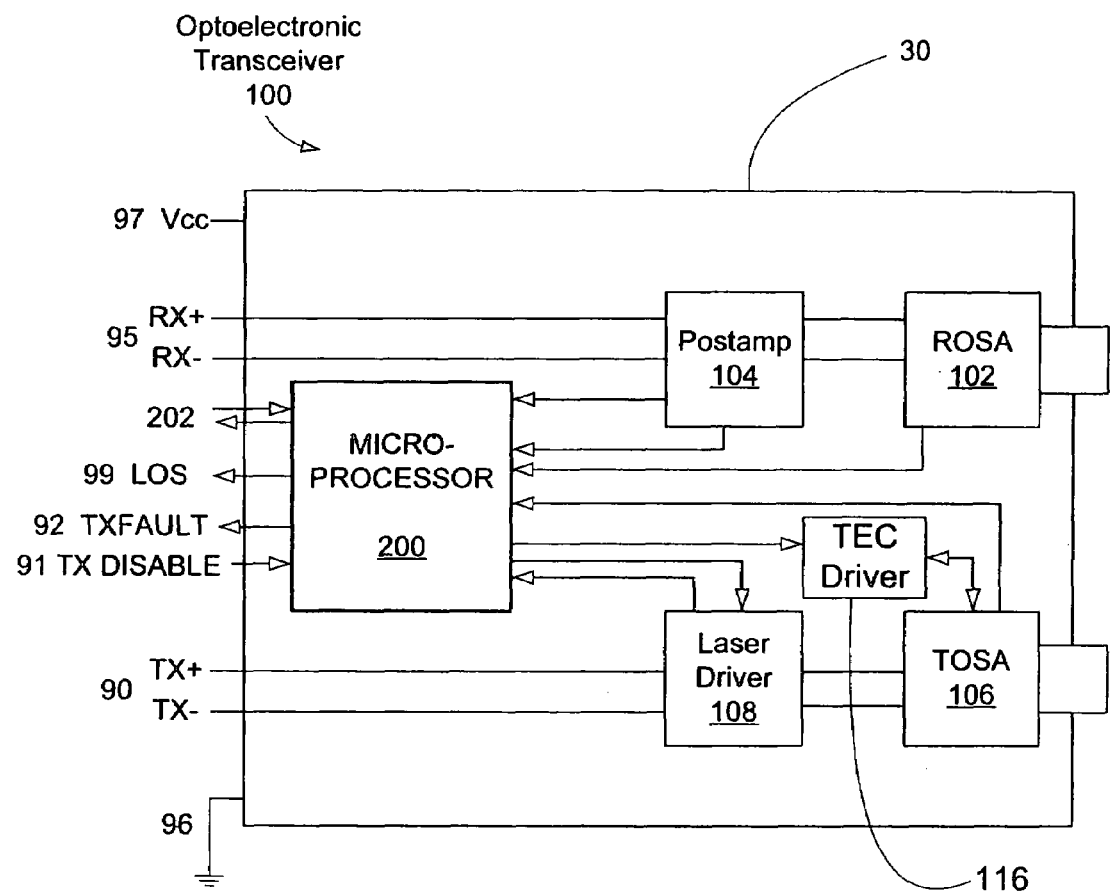
FIG. 4 is a block diagram of an embodiment of an optoelectronic transceiver.

FIG. 4 shows a schematic representation of a fiber optic transceiver 100. Transceiver 100 contains at a minimum transmit and receiver circuit paths and power 97 and ground connections 96. Further, transceiver 100 includes a Receiver Optical Subassembly (ROSA) 102, which contains a mechanical fiber receptacle and coupling optics, as well as a photo diode and a pre amplifier (preamp) circuit. ROSA 102 is in turn connected to a post amplifier (postamp) integrated circuit 104, the function of which is to take relatively small signals from ROSA 102 and amplify and limit them to create a uniform amplitude digital electronic output, which is connected to outside circuitry via the RX+ and RX− pins 95. The postamp circuit 104 provides a digital output signal known as Signal Detect or Loss of Signal indicating the presence or absence of suitably strong optical input. All the components of the transceiver 100 are preferably located in a protective housing 30, except for connectors that may protrude from the housing.

Suitable housings, including metallic, plastic, potting box and other housing structures are well known in the art. In one embodiment, the protective housing 30 are as follows: width, 3 cm or less; length, 6.5 cm or less, and height, 1.2 cm or less. A GBIC standard (SFF-8053 GBIC standard version 5.5) requires the dimensions of a module housing to be approximately 3 cm×6.5 cm×1.2 cm. Thus, the protective housing 30 of this embodiment meets the form factor requirements of the GBIC standard. In another embodiment, the physical dimensions of the module housing are: width, 0.54 inches or less; length, 2.24 inches or less; and height, 0.34 inches or less. The SFP MSA (Small Form Factor Pluggable Multi-source Agreement) requires the dimensions of a compliant module housing to be approximately 0.54"× 2.24"×0.34". Thus, the module housing in that embodiment meets the form factor requirements of the SFP standard.

Note that the present invention is not limited to the form factor requirements described above. A person of ordinary skill in the art having the benefit of this disclosure will appreciate that the present invention is adaptable to various existing or yet to be determined form factors, some of which can be smaller or larger than the ones identified here.

The transmit circuitry of transceiver 100 consists of a Transmitter Optical Subassembly (TOSA) 106 and a laser driver integrated circuit 108, with signal inputs obtained from the TX+ and TX pins 90. TOSA 106 contains a mechanical fiber receptacle and coupling optics, as well as a thermo-electric cooler (TEC) and a laser diode or LED. The laser driver circuit 108 provides AC drive and DC bias current to the laser. The signal inputs for the driver are obtained from I/O pins (not shown) of transceiver 100. In other embodiments, the TEC is external to the TOSA 106. In yet other embodiments, the TEC is integrated within a transistor-outline (TO) package.

In addition, the optoelectronic transceiver 100 includes a thermo-electric cooler (TEC) driver 116 and additional circuitry that is not shown for controlling the temperature of the TOSA 106. An embodiment of the TEC driver 116 and the additional circuitry is described in greater detail below in connection with FIG. 5.

Also shown in FIG. 4 is microprocessor 200, which may comprise one or more chips, configured for controlling the operations of the transceiver 100. Suitable microprocessors include the PIC16F873A, PIC16F870 and PIC16F871 8-bit CMOS FLASH microcontrollers manufactured by Microchip Technology, Inc. and many other similar devices. Microprocessor 200 is coupled to provide control signals to the post-amplifier 104 and laser driver 108, and these components and the ROSA 102 and TOSA 106 provide feedback signals back to the microprocessor 200. For example, microprocessor 200 provides signals (e.g., bias and amplitude control signals) to control the DC bias current level and AC modulation level of laser driver circuit 108 (which thereby controls the extinction ratio (ER) of the optical output signal), while post-amplifier circuit 104 provides a Signal Detect output to microprocessor 200 to indicate the presence or absence of a suitably strong optical input.

Importantly, the bias current level and the AC modulation level both affect the optical output wavelength of transceiver 100. Persons skilled in the art recognize that increases in the bias current and, to a lesser extent, increases in the AC modulation can increase the temperature of the active region of a laser chip. More specifically, as the bias current and AC modulation increase, so does the power dissipation of the laser chip. And as the power dissipated in the laser chip increases, so does the temperature of the laser chip, which has a fixed thermal resistance. This is true even though the temperature at the base of the laser chip is typically controlled by the TEC.

Temperature and/or other physical conditions of various components of transceiver 100 may be acquired using sensors that are coupled to microprocessor 200. In some embodiments, conditions of the optical links may also be acquired using the sensors.

In addition to, and sometimes in conjunction with these control functions, there are a number of other tasks that may be handled by microprocessor 200. These tasks include, but are not necessarily limited to, the following:

Setup functions. These generally relate to the required adjustments made on a part to part basis in the factory to allow for variations in component characteristics such as laser diode threshold current.

Identification. This refers to the storage of an identity code within a general purpose memory (e.g., an EEPROM). Additional information, such as sub component revisions and factory test data, may also be stored within the general purpose memory for purposes of identification.

Eye safety and general fault detection. These functions are used to identify abnormal and potentially unsafe operating parameters and to report these to the host device and/or perform laser shutdown, as appropriate. Sensors may be used to identify such abnormal or potentially unsafe operating parameters.

Receiver input optical power measurement. This function is used to measure the input optical power and a report of this measurement may be stored in the memory.

Laser diode drive current. This function is used to set the output optical power level of the laser diode.

Laser diode temperature monitoring and control. In one embodiment, a temperature controller (e.g., a thermal-electric cooler (TEC)) is disposed in or near TOSA 106 for controlling the temperature of the laser emitter therein. In this embodiment, microprocessor 200 is responsible for providing control signals to the temperature controller.

Note that transceiver 100 has a serial interface 202 for communicating with a host device. As used herein, a host device refers to a link card to which a transceiver is attached and/or a host system computer to which a transceiver provides an optical connection. Host systems may be computer systems, network attached storage (NAS) devices, storage area network (SAN) devices, optoelectronic routers, as well as other types of host systems and devices.

In some embodiments the optoelectronic transceiver 100 includes an integrated circuit controller that may perform some of the functions listed above. For example, an integrated circuit controller performs the tasks of identification and eye safety and general fault detection, while the microprocessor provides control signals to the temperature controller and also may perform other tasks.

Further, the optoelectronic transceiver may also include the TX disable 91 and TX fault 92 pins described in the GBIC (Gigabit Interface Converter) standard. In the GBIC standard (SFF-8053), the TX disable pin 91 allows the transmitter to be shut off by the host device, while the TX fault pin 92 is an indicator to the host device of some fault condition existing in the laser or associated laser driver circuit.

Figure 5:
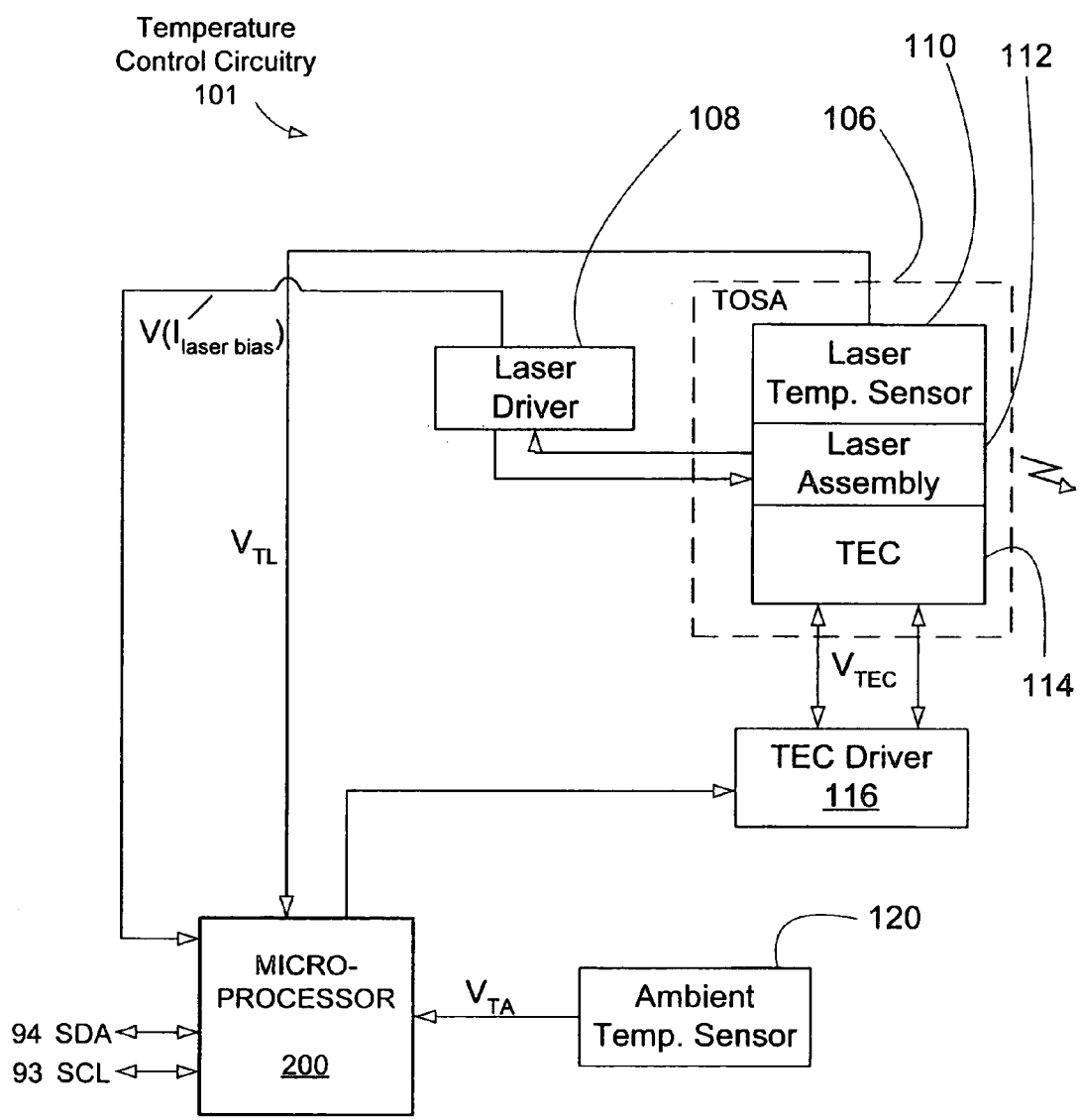
FIG. 5 is a block diagram illustrating an embodiment of circuitry for controlling the temperature of a laser emitter.

FIG. 5 illustrates a portion of temperature control circuitry 101 of the transceiver 100. The temperature control circuitry 101 is coupled to a TOSA 106. In some embodiments, TOSA 106 includes a laser assembly 112, which in turn includes a laser emitter that is activated when a positive bias current, $I_{laser\ bias}$, is applied across its p-n junction. Also shown in FIG. 5 are a laser temperature sensor 110 and a thermo-electric cooler (TEC) 114 coupled to the laser assembly 112. In some other embodiments, the laser temperature sensor 110 and/or the TEC 114 are integrated within the laser assembly 112. In yet other embodiments, the laser temperature sensor 110 and/or the TEC 114 are external to the TOSA 106.

In some embodiments, the laser temperature sensor 110 is a thermistor. Any other device suitable for measuring the temperature of the laser diode may also be used. The laser temperature sensor 110 generates a signal ($V_{TL}$) that varies as a function of the temperature of the laser diode. As described above, and as is well known to those skilled in the art, the wavelength of optical signals generated by a laser diode varies as a function of the temperature of the laser diode. Accordingly, in other embodiments, a sensor that measures the wavelength of the optical signals directly may be substituted for the laser temperature sensor 110. In still other embodiments, a device measuring an operating condition of the laser diode that varies as a function of the temperature of the laser diode is used instead of the laser temperature sensor 110.

With reference still to FIG. 5, laser driver circuitry 108 supplies both AC drive power and a positive DC bias current $I_{laser\ bias}$ to the laser assembly 112 to activate the laser emitter and to set the AC modulation of the laser assembly. The microprocessor 200 controls this aspect of the laser driver circuitry 108 via the bias control signal and the amplitude control signal. The laser driver circuitry 108 also transmits a voltage $V(I_{laser\ bias})$, which is proportional to the $I_{laser\ bias}$, so that the microprocessor 200 may indirectly monitor the actual value of $I_{laser\ bias}$, which may vary due to operating conditions such as temperature. In some embodiments, the microprocessor 200 monitors a signal from a back facet photodiode (also called a monitor photodiode) instead of (or in addition to) the voltage $V(I_{laser\ bias})$. In some embodiments the microprocessor 200 uses the monitored signal(s) to determine an adjustment to the DC bias current$_1$.

An additional input is provided to the microprocessor 200 by an ambient temperature sensor 120, which measures the ambient temperature surrounding the TOSA 106 and generates a signal ($V_{TA}$) for the microprocessor 200 that varies as a function of the ambient temperature. Although a laser temperature sensor 110 is preferably placed in the proximity of a laser emitter, the temperature reading from the laser temperature sensor 110 generally differs from the actual temperature of the laser emitter because the laser temperature sensor 110 is physically separated from the laser emitter. As a consequence, the temperature reading from the laser temperature sensor 110 and its signal $V_{TL}$ vary as a function of the outside temperature. By receiving the ambient temperature signal $V_{TA}$, the microprocessor 200 is able to compensate for the effect of the ambient temperature on the temperature reading from the laser temperature sensor.

Figure 6:
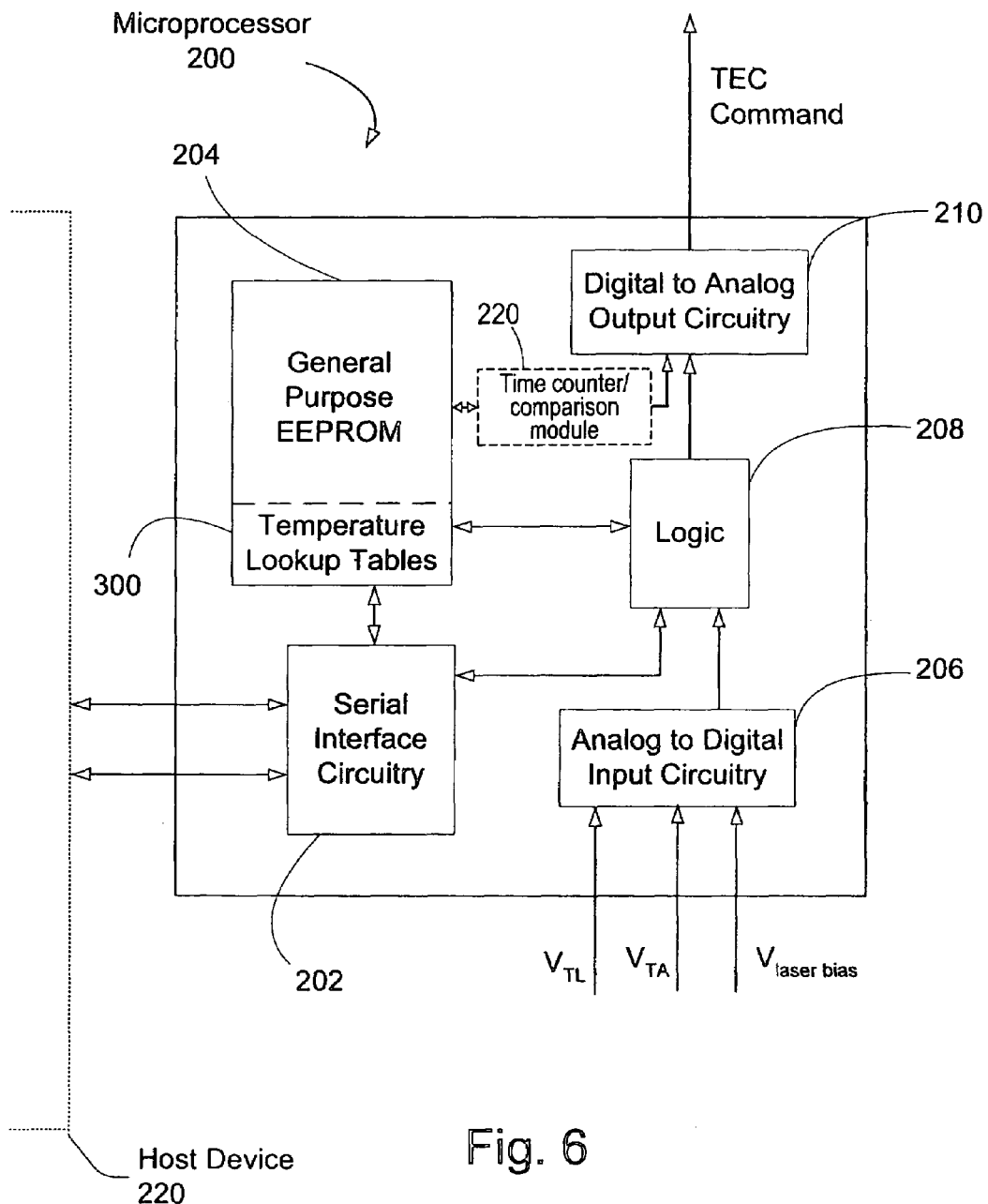
FIG. 6 is a block diagram depicting a portion of a circuit implementing the microprocessor of FIG. 5.

In addition to the $V(I_{laser\ bias})$, $V_{TL}$ and $V_{TA}$ signals, the microprocessor 200 receives inputs from a host device 220 through serial interface circuitry 202 (FIG. 6). In some embodiments, using the information collected from the host device, the laser driver circuitry 108 and the ambient temperature sensor 120, the microprocessor 200 generates an analog TEC Command signal to set the temperature of the laser emitter in the laser assembly 112. In particular, the microprocessor 200 generates the TEC Command signal based on inputs of $V(I_{laser\ bias})$ from the laser driver circuitry 108, $V_{TL}$ from the laser temperature sensor, $V_{TA}$ from the ambient temperature sensor 120, and calibrated values previously stored within the microprocessor 200 during the calibration of the optoelectronic transceiver 100.

The TEC Command signal is provided to the TEC driver circuitry 116. The TEC driver circuitry 116 is configured to generate an output signal $V_{TEC}$ to drive the TEC 114 in accordance with the TEC Command signal.

FIG. 6 is a logical block diagram illustrating a portion of a circuit implementing the microprocessor 200. The microprocessor 200 includes serial interface circuitry 202 coupled to host device interface input/output lines. In some embodiments, the serial interface circuitry 202 operates in accordance with the two wire serial interface standard that is also used in the GBIC (Gigabit Interface Converter) and SFP (Small Form Factor Pluggable) standards; however, other serial interfaces could equally well be used in alternate embodiments. In yet other embodiments, a multiple-pin interface could be used in place of a serial interface. The interface circuitry 202 is used for setup and querying of the microprocessor 200, and enables access to the optoelectronic transceiver 100 by a host device 220 connected thereto. The microprocessor can also include a time counter/comparison module 220, as will be discussed in greater detail with respect to FIG. 15.

The microprocessor 200 may also include one or more volatile and/or nonvolatile memory devices, such as a general purpose EEPROM (electrically erasable and programmable read only memory) device 204, as shown in FIG. 4. Tables and parameters may be set up using the EEPROM device 204 by writing values to predefined memory locations in the memory devices, and various output values may be output by reading from predetermined memory locations in the memory devices. Included in the EEPROM device 204 are one or more lookup tables, which may be used to assign values to control outputs as a function of inputs provided by various sensors.

Also as shown in FIG. 6, the microprocessor 200 includes analog to digital circuitry (A/D) 206 for receiving analog signals from other parts of the optoelectronic transceiver 100 and converting the analog signals to digital values, which may be processed by the digital control logic 208. The control logic 208 is configured to receive digital values from the A/D 206 as well as lookup tables, from the EEPROM 204 and from the host device 220 through the serial interface 202. In addition, the control logic 208 is configured to write selected digital values to predefined memory locations in the EEPROM 204 and output digital values to host devices when polled through the serial interface circuitry 202. Furthermore the control logic 208 is configured to determine the TEC Command signal using the methodology described above. In one embodiment, the control logic 208 is implemented by software instructions executable by the microprocessor 200. In this embodiment, the methodology and/or mathematical formula used to determine the TEC Command signal can be updated and modified without having to replace the microprocessor 200.

Lastly, as illustrated in FIG. 6, digital to analog output circuitry (D/A) 210 is provided to receive digital values from the control logic 208 and convert them into analog signals to regulate other parts of the optoelectronic transceiver 100.

As described in detail above, the wavelength intervals of a channel spacing standard at 100 GHz is 0.8 nm. In order to operate at two channels, therefore, the transceiver 100 must be able to adjust the wavelength output by at least 0.8 nm. Similarly, to operate at three channels, the transceiver 100 must be able to adjust the wavelength output by at least 1.6 nm. The degree to which the wavelength output must be adjusted continues in this fashion for each additional channel. But as indicated above, the channel limit of a 100 GHz channel spacing standard is 45. The channel spacing, and thus the ability of the transceiver 100 to adjust the wavelength output varies proportionally with the channel spacing standard.

In order to control the wavelength output of the transceiver 100, the temperature of laser emitters is adjusted as described in detail below. And as indicated above, the relationship between the temperature of the laser emitter and the wavelength produced is typically around 0.1 nm/° C. This means that if the wavelength output of the transceiver 100 must be adjusted by, for example, is 0.8 nm, the laser emitter temperature must be adjusted by approximately 8° C. Similarly, if the wavelength output of the transceiver 100 must be adjusted by, for example, is 1.6 nm (to support 3 channel selectability), the laser emitter temperature must be adjusted by approximately 16° C.

Figure 7:
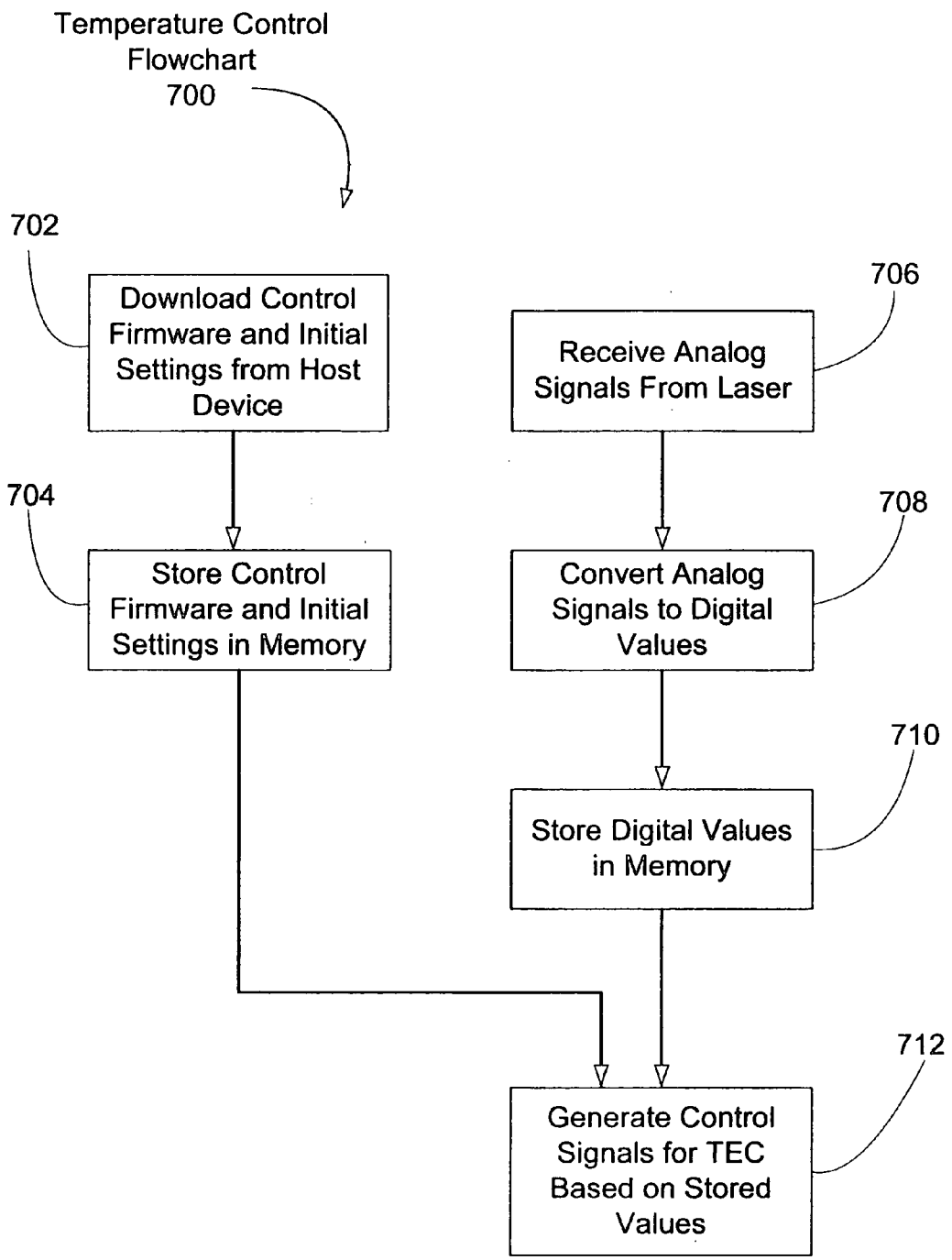
FIG. 7 is a flowchart depicting process steps for controlling the temperature of a laser emitter.

FIG. 7 is a flowchart for controlling the temperature of laser emitters using a microprocessor 200. In step 702 control firmware and initial settings are downloaded from a host device, such as a computer, preferably through serial interface circuitry 202. The control signals include data relating to laser aging and the effect of ambient temperatures on the wavelength of optical signals from a laser emitter, and they may be transmitted to the microprocessor 200 in the optoelectronic transceiver 100 during calibration of the optoelectronic transceiver, as described below. The control commands and signals are stored in the EEPROM 204 (FIG. 6) in step 704. The receipt and storage of control commands and signals in steps 702 and 704 may be accomplished prior to operation of the laser emitter, or while the laser emitter is operating. During operation of the laser emitter, analog signals representing a variety of operating conditions of the laser emitter, including its temperature, the voltage corresponding to the laser bias current, and the ambient temperature surrounding the laser emitter, are generated and received by a microprocessor 200 (FIG. 6) in step 706. The analog signals are converted to digital values in step 708 and stored in the EEPROM 204 of the microprocessor 200 in step 710. Lastly, in step 712 the microprocessor 200 generates control signals for the temperature control mechanism, which preferably includes a TEC 114 and a TEC driver 116, based on the control signals and digital values that have been stored in the EEPROM 204 of the microprocessor 200 during the preceding steps.

Figure 8:
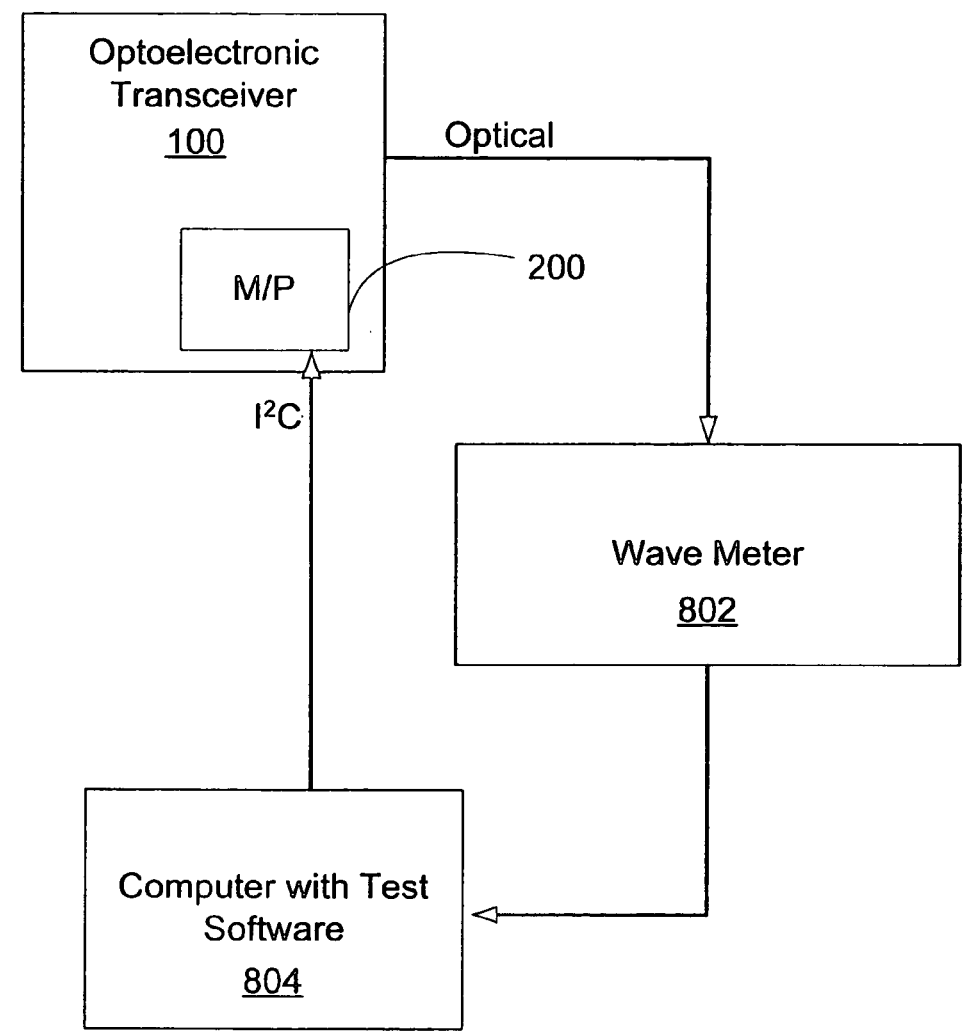
FIG. 8 is a diagram of a setup and tuning system.

FIG. 8 is a logical block diagram illustrating a system for setup and tuning of an optoelectronic assembly. As described above, in applications using Dense Wavelength Division Multiplexing (DWDM), laser emitters must be tuned to transmit optical signals having wavelengths that correspond to ITU channels. The spacing of the ITU channels for DWDM at 100 GHz is 0.8 nm±0.1 nm, at 200 GHz is 1.6 nm±0.2 nm, and at 50 GHz is 0.4 nm±0.05 nm. Laser diodes that are commercially available generally include specification data on the wavelength of optical signals the laser diodes emit while operating at room temperature. However, it is desirable to operate laser diodes used in optoelectronic assemblies above the ambient temperature.

Generally, operating laser diodes above the ambient temperature allows TECs to function more efficiently. More specifically, TECs are more efficient when heating than cooling because the thermoelectric effect and resistive heating are working together when the TECs are heating the laser diodes, rather than opposing one another as is the case when the TECs are cooling the laser diodes. Efficiency is of particular importance in pluggable transceiver applications, where the available power, and thus the ability of TECs to function, is limited to specified levels. But operating laser diodes at high temperatures may shorten the useful life of the laser diodes.

It is therefore preferable for many applications to tune a laser diode by adjusting the TEC Command signal so that the laser diode emits optical signals that fall within a desired ITU channel wavelength for a selected DWDM frequency when the operating temperature of the laser diode is as high as possible, but not more than 50° C.

With reference to FIG. 8, an optoelectronic transceiver 100 is coupled to transmit optical signals to a wave meter 802. The wave meter 802 measures the wavelength of the optical signals and provides the wavelength to a computer 804 with test software. The computer 804 sends signals to the optoelectronic transceiver 100 through a serial interface using the two wire serial interface standard to adjust the temperature of the laser emitter until the target wavelength for one or more ITU channels is reached as described in detail below.

Figure 9:
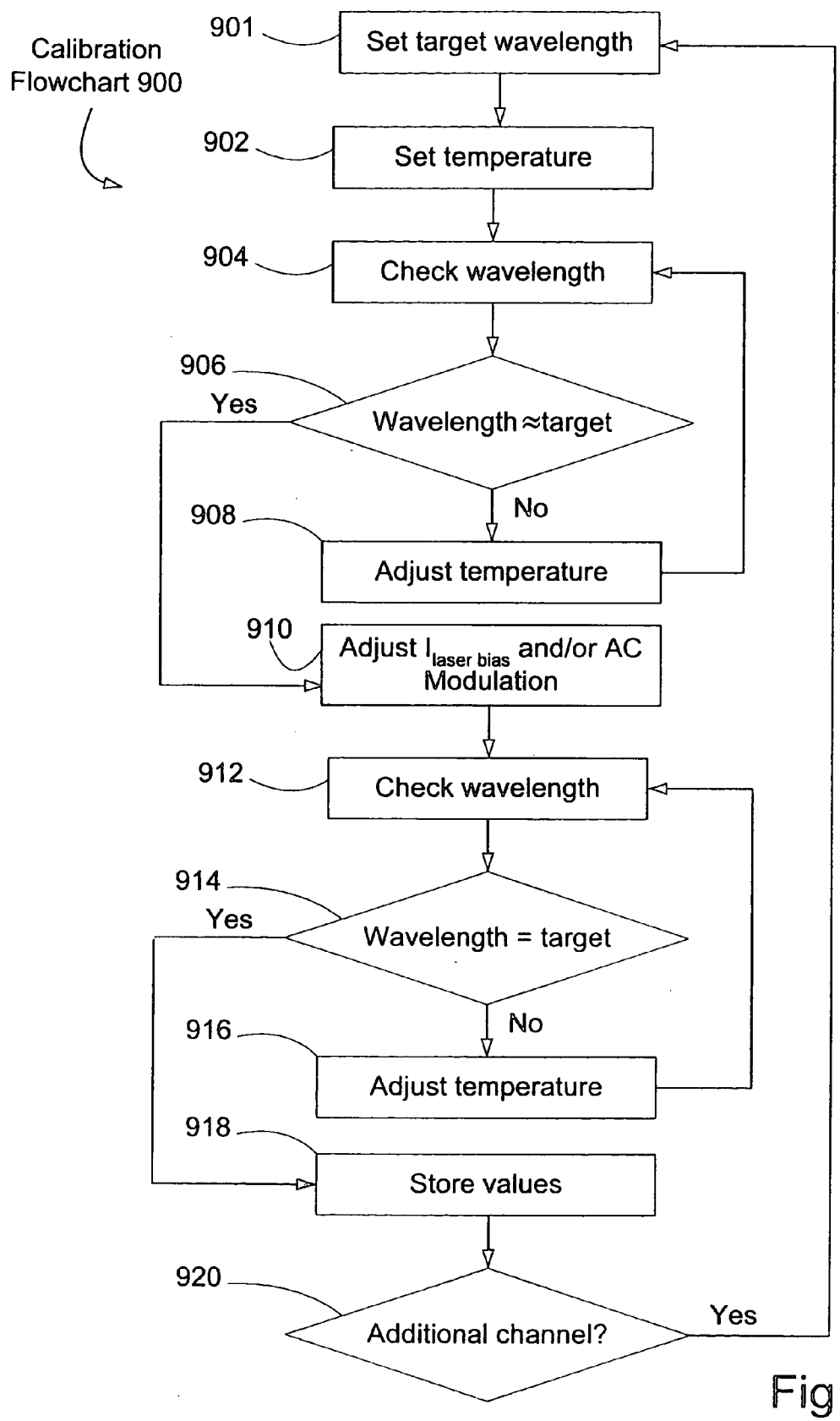
FIG. 9 is a flowchart depicting process steps for calibrating a laser emitter.

FIG. 9 includes a flowchart for calibrating an optoelectronic transceiver 100. In preferred embodiments, the transceiver 100 is calibrated to operate within one or more ITU channels. In a first step, the computer 804 sets a target wavelength (step 901). This may be accomplished, for instance, by heating the optoelectronic transceiver to 50° C., decreasing the temperature until a first ITU channel is found, and then setting the target wavelength to a wavelength with that ITU channel. While the target wavelength lies within an ITU channel, it is not necessarily at the center of the channel. In some embodiments, the target wavelength is lower than the center wavelength to allow for red-shifting that occurs when lasers age as described in more detail below.

And as indicated below, the process of calibrating the transceiver 100 to operate within, for example, two or more channels typically proceeds from the highest channel to the lowest channel. So when step 901 is executed for the first time (in the context of two or more channels), the target wavelength typically corresponds to the highest channel. The calibration process then steps through the channels sequentially as steps 901–918 are executed for each channel. If the laser is calibrated for operation in only one channel, steps 901–918 may be executed just one time.

The computer 804 then commands the microprocessor 200 to set the temperature of the laser emitter in the laser assembly 112 (via the TEC Command signal) (step 902). The first time step 902 is executed, the temperature is preferably set to $T_{setup}$ or 50° C., which is the preferred maximum operating temperature of the laser assembly 112. During subsequent executions of step 902, however, the temperature is set differently. As described below in connection with step 916, a final temperature for a given channel is selected. When calibrating the next channel, the temperature set in step 902 is preferably this final temperature offset by a predefined amount. For example, if the channel spacing 0.8 nm, this predefined offset may be 7 or 8° C. (i.e., the temperature set in step 902 would be approximately 7 or 8° C. less than the final temperature for the previously calibrated channel).

Additionally, the computer 804 may communicate with the microprocessor 200 through the serial interface 202. The computer 804 may also set $I_{laser\ bias}$ and the AC modulation to default values.

The computer 804 then checks the wavelength of the optical signals via the wave meter 802 (step 904). If the measured wavelength is not approximately equal to the target wavelength (step 906-No), the computer 804 adjusts the temperature of the laser emitter in the laser assembly 112 (step 908). Preferably, the measured wavelength is not approximately equal to the target wavelength until they are within 10 pm of each other. The direction of the adjustment depends upon whether the measured wavelength is greater than or less than the target wavelength. Preferably, the first adjustment is a reduction since the temperature must be less than or equal to $T_{setup}$. Further, the adjustment of the temperature in step 908 represents a coarse adjustment such that it preferably corresponds to a 3–10 pm adjustment of the optical signal's wavelength (depending on the resolution of the D/A 210 and the configuration of the transceiver generally). The goal of steps 904–908 is to get the wavelengths to approximately match, not exactly match so the amount of the reduction in step 908 does not have to be very fine. The computer 904 then repeats steps 904–908 until the measured wavelength is approximately equal to the target wavelength.

Once the measured wavelength is approximately equal to the target wavelength (step 906-Yes), the computer 804 adjusts the DC bias and the AC modulation current to achieve the operational target values for laser power and extinction ratio (step 910). In some embodiments, this step may be accomplished using a digital communications analyzer or other external equipment to measure the laser power and extinction ratio while the DC bias and AC modulation current are adjusted. The precise operational target values may vary from one embodiment to the next. In an alternate embodiment, step 910 can be skipped during the calibration of channels other than the first channel, if the channels are sufficiently close that the DC bias and AC modulation levels for the first channel are also suitable for use with those other channels.

The computer 804 then checks the wavelength of the optical signals via the wave meter 802 (step 912). If the measured wavelength is not equal to the target wavelength (step 914-No), the computer 804 adjusts the temperature of the laser emitter in the laser assembly 112 (step 916). Typically, the measured wavelength is "equal" to the target wavelength once it is within 1–5 pm of the target wavelength. Again, the direction of the adjustment depends upon whether the measured wavelength is greater than or less than the target wavelength. Further, the amount of the temperature reduction in step 916 is preferably smaller than the amount of the reduction in step 908. For example, the adjustment in step 916 may correspond to a 1–3 pm adjustment of the optical signal's wavelength (depending on the resolution of the D/A 210 and the configuration of the transceiver generally).

Figure 10:
FIG. 10 is a diagram of a channel lookup table.

When the measured wavelength is determined to be equal to (or within a predefined margin of) the target wavelength (step 914-Yes), the computer 804 stores values corresponding to (or representing) the temperature of the laser emitter, the DC bias current $I_{laser\ bias}$, and the AC modulation in a channel lookup table 1000 (FIG. 10) maintained by the EEPROM 204 of the microprocessor 200 (step 918). FIG. 10 illustrates an exemplary channel lookup table 1000, which includes a channel designation and corresponding values for the TEC temperature of the laser emitter, the DC bias current $I_{laser\ bias}$, and the AC modulation.

If there is an additional channel for calibration (step 920-Yes), steps 901–918 are executed for the additional channel. If not, the calibration process terminates.

During the operation of the transceiver 100, the microprocessor 200 may receive commands through the serial interface 202 to select one of the channels for which the calibration steps described above have been executed. In still other embodiments, a specific channel is selected just once, in which case the transceiver 100 is then semi-permanently configured to operate at the selected channel. In either case, the microprocessor 200 uses a channel identifier preferably included with the commands to look up corresponding temperature, the DC bias current $I_{laser\ bias}$, and AC modulation values and configures the transceiver 100 accordingly.

In some embodiments, a transceiver controller (not illustrated) is used to perform some of the functions otherwise performed by the microprocessor 200. For example, a transceiver controller may be used to look up values in tables and outputting these values through one or more digital to analog converters. Accordingly, the lookup table 100 (or portions of the lookup table 100) may also be accessible to or stored by the transceiver controller so that it may output some control signals while the microprocessor 200 outputs other control signals.

Attention now turns to an embodiment in which characteristics of lasers that change over time are compensated for in one or more ways.

Figure 11A:
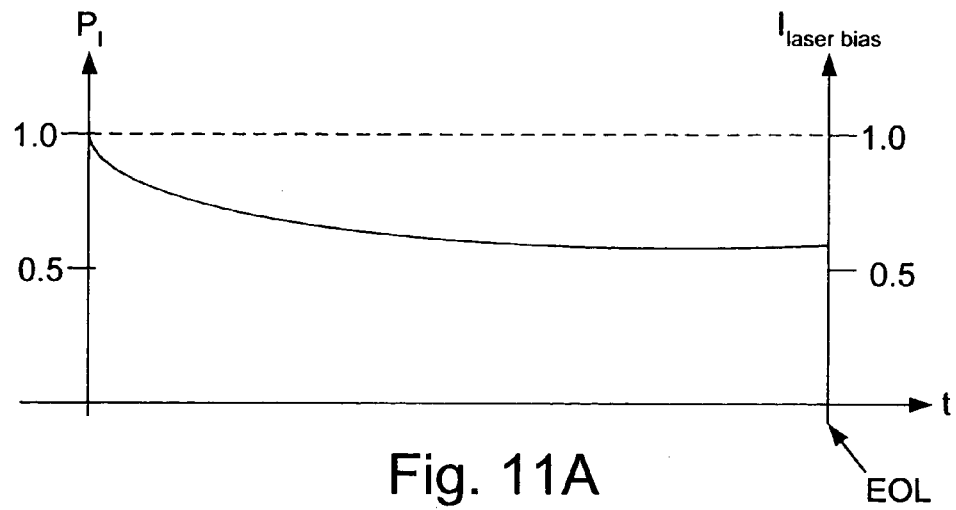
FIGS. 11A and 11B illustrate plots of power and current in a laser over time.

FIG. 11A includes a conceptual representation of a typical plot of the optical power level, $P_1$, and $I_{laser\ bias}$ of the laser diode in a transceiver 100 configured such that $I_{laser\ bias}$ is constant over a period of time. $P_1$ is represented by a solid line and $I_{laser\ bias}$ is represented by a dashed line. As shown, $P_1$ decreases in a weak exponential fashion. The end of life ("EOL") of the laser diode, which may be twenty five years, is marked in the plot and corresponds to a decay in $P_1$ that is typically less than one half.

Figure 11B:
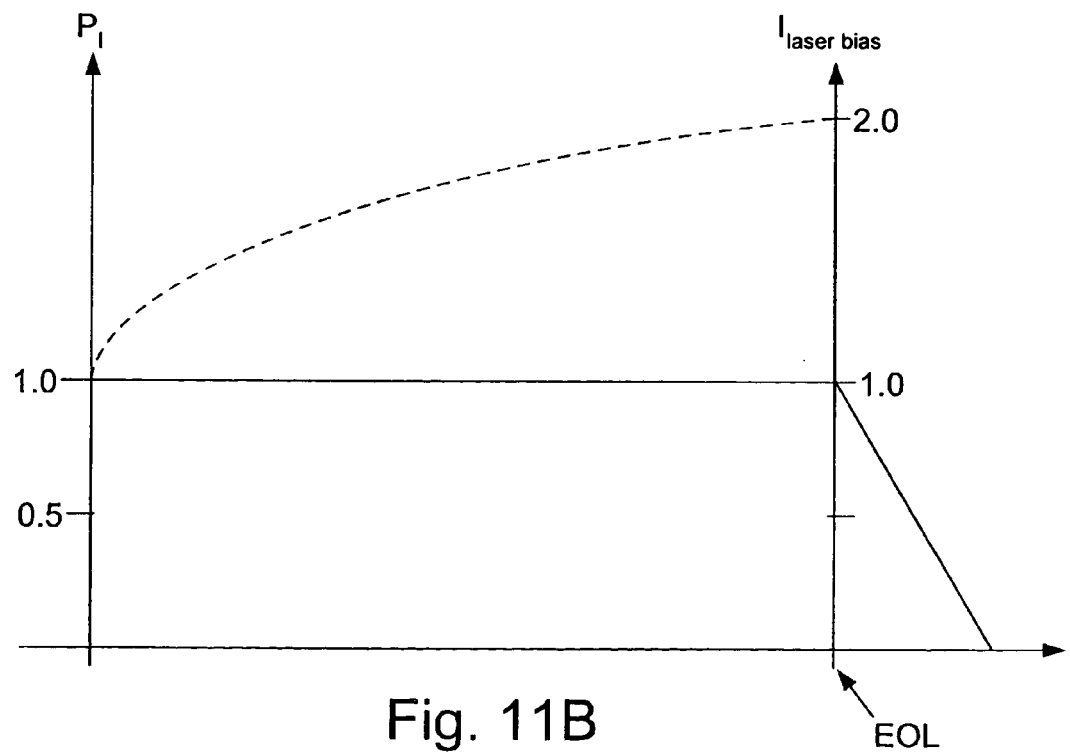

FIG. 11B includes a conceptual representation of a typical plot of $P_1$ and $I_{laser\ bias}$ of the laser diode in a transceiver 100 configured such that $P_1$ is constant over a period of time. Again, $P_1$ is represented by a solid line and $I_{laser\ bias}$ is represented by a dashed line. As shown, $P_1$ remains constant until the EOL, at which point $P_1$ typically declines in a nearly linear fashion. $I_{laser\ bias}$ approximately doubles over time to maintain $P_1$ constant until the EOL, at which point the laser diode can no longer increase $I_{laser\ bias}$ to keep $P_1$ constant. As stated above, the temperature of the laser, $T_1$, increases with $I_{laser\ bias}$, which causes the wavelength of the laser to increase (i.e., a red shift). Further, since the temperature sensor of the TEC is typically remote from the laser emitter, the temperature of the laser emitter will increase, even when the temperature sensed by the temperature sensor of the TEC is well controlled. The present invention, in part, compensates for the change in the wavelength resulting from the change in laser emitter temperature due to increases in $I_{laser\ bias}$.

Additionally, persons skilled in the art know that the change in $T_1$ ($\Delta T_1$) is equal to the change in $P_1$ ($\Delta P_1$) times the thermal resistance of the laser diode, $R_1$ (i.e., that $\Delta T_1 = \Delta P_1 * R_1$) and that $\Delta P_1$ is equal to the change in $I_{laser\ bias}$ ($\Delta I_{laser\ bias}$) times the change in laser voltage $V_{laser}$ (i.e., $\Delta P_1 = \Delta I_{laser\ bias} * \Delta V_{laser}$). Changes in laser voltage ($\Delta V_{laser}$) caused by changes in laser current ($\Delta I_{laser\ bias}$) are typically very small, where the series resistance of the laser is small, which is the case in preferred embodiments. Therefore, the effect on laser voltage is small and can be practically ignored. The result is that the equations above can be simplified as follows: $\Delta P_1 \alpha \Delta I_{laser\ bias}$ and $\Delta T_1 \alpha \Delta I_{laser\ bias} * R_1$. Thermal resistance is a constant for a given device, and therefore the change in laser temperature is roughly proportional to the change in laser current ($\Delta T_1 \alpha \Delta I_{laser\ bias}$).

Since changes in laser wavelength are proportional to changes in laser temperature, in can be inferred from the above equation that the change in laser wavelength ($\Delta \lambda$) is also proportional to the change in bias current ($\Delta \lambda \alpha \Delta I_{laser\ bias}$). Thus, in this first relationship, changes in $I_{laser\ bias}$ are proportional to changes in the wavelength of the laser diode because the wavelength increases as $I_{laser\ bias}$ increases. Another way to state this is that the wavelength of light output by a laser diode can be represented as linear function of $I_{laser\ bias}$. It is noted that even if the relationship between wavelength and $I_{laser}$ bias is not strictly linear, this relationship can be treated as being linear in the small region of operation that is relevant to operation of the laser.

As stated above, if the laser emitter temperature is increased by 10° C., the wavelength increases by about 1 nm. The precise nature of this first relationship may be determined for a given laser diode or class of laser diodes by experimentation or calculation. A determination of this relationship is a way of characterizing the behavior of the laser diode.

Another way of characterizing a laser diode is by reference to the laser diode's index of refraction. Laser diodes include a laser cavity that may be characterized by an index of refraction, $n_1$, which may increases over time. Further, persons skilled in the art recognize that 1) the wavelength of the laser diode is inversely proportional to (i.e., an inverse function of) the index of refraction (i.e., $\lambda \alpha 1/n_1$); 2) that $n_1$ is proportional to (i.e., is a linear function of) the current density of the laser diode, $I_d$, times $T_1$ (i.e., $n_1 \alpha I_d * T_1$); and 3) that $I_d$ is equal to the area of the laser junction of the laser diode, $A_{1j}$ times $I_{laser\ bias}$ (i.e., $I_d = A_{1j} * I_{laser\ bias}$). Combining these relationships as follows: $\Delta\lambda\alpha 1/(I_d * T_1)$ $\Delta\lambda\alpha 1/(A_{1j} * I_{laser\ bias} * T_1) \rightarrow \Delta\lambda\alpha 1/I_{laser\ bias}$, where $T_1$ is a function of $I_{laser\ bias}$ and $A_{1j}$ which may be fixed and repeatable for laser diodes or a class of laser diodes. In other words, the result of combining these relationships is that the changes in the wavelength of the laser diode are also inversely proportional to $I_{laser\ bias}$. So in this second relationship, as $n_1$, and thus $I_{laser\ bias}$, increases, the wavelength of the laser diode decreases (i.e., a blue shift). The precise nature of this second relationship may be determined for a given laser diode by experimentation and/or calculation.

A complicating factor is that the strength of the first and second relationships may independently vary over time and by laser diode type. Thus the extent to which the first and second relationships offset one another (e.g., the extent to which one of the relationships dominates) may vary over time and by laser diode type or class. But even this complicating factor may be quantified through experimentation and/or calculation.

By quantifying these relationships, the laser controller can be configured to compensate for predicted wave length shifts, by making adjustments to the TEC temperature set point, such that the laser diode may be able operate within a narrow wavelength tolerance for extended times (e.g., 20 or 25 years, as is typically required for telecommunications applications).

A result of quantifying the first and/or second relationship may be a lookup table with entries for 1) time, temperature, and $I_{laser\ bias}$; 2) time and temperature; or 3) temperature and $I_{laser\ bias}$. FIG. 12A illustrates an exemplary lookup table 1200 with columns for time, temperature, and $I_{laser\ bias}$. The temporal entries may correspond to, for example, a counter value maintained within the microprocessor 200 that is updated periodically during the operation of the laser diode. Reference may be made to such a lookup table 120 by the microprocessor 200 during the operation of the laser diode to adjust the target temperature of the TEC 114 as needed. For example, the microprocessor 200 may be configured to reference this lookup table 120 periodically during the operation of the laser diode, locate a row with a temporal value that corresponds to the counter value, and adjust the target temperature of the TEC 114 by reference to the temperature value in this row. Alternatively, the microprocessor 200 may be configured to monitor the value of $I_{laser\ bias}$ and reference this lookup table 120 periodically or whenever this value changes by a predetermined amount. The microprocessor 200 may locate a row with an $I_{laser\ bias}$ value that corresponds to the measured value of $I_{laser\ bias}$ and adjust the target temperature of the TEC 114 by reference to the temperature value in this row. Further, the microprocessor 200 may select a row that most closely matches a given temporal or $I_{laser\ bias}$ value or interpolate a target temperature by reference to two or more rows in a lookup table 1210, 1200 that most closely matches a given temporal or $I_{laser\ bias}$ value.

In other embodiments, instead of using a lookup table, the microprocessor 200 implements wavelength compensation using a computation that is a function of a measured operating parameter of the laser diode, such as the bias current. For instance, the compensation can be a computed function of a ratio, $\Delta\lambda/\Delta I_{laser\ bias}$, determined either during calibration of the laser diode or determined for all laser diodes of a particular type. For instance, if it determined during calibration that wavelength change by 5 pm when bias current changes by 1 mA ($\Delta\lambda/\Delta I_{laser\ bias}$=5 pm/mA), then the microprocessor can be programmed to increase the TEC control (to increase the amount of cooling) by a predefined increment when the bias current increases by 1 mA, where each increment in the TEC control corresponds to a wavelength change of 5 pm.

Another characterization of the laser diode may include a determination that the wavelength of the laser diode will shift higher or lower during a given period of time. Similarly, it may be determined that the wavelength of the laser diode will shift higher or lower by a specific amount during a given period of time. In either of these cases, it may not be known how much the shift will be at any specific time or value of $I_{laser\ bias}$. In such cases, it may only be possible to shift the initial target wavelength by a certain amount to compensate for a wavelength drift with an expected direction or direction and magnitude.

Still another result of such activity may be a characterization of the laser diode that allows for an initial adjustment of the target wavelength in combination with an ongoing adjustment of the target temperature of the TEC 114 by reference to temporal or $I_{laser\ bias}$ values during the operation of the laser diode. The on going adjustment may be a single adjustment of the target temperature during the operational lifetime of the laser diode, or may comprise a sequence of such adjustments over the device's operational lifetime.

Yet another result of quantifying these relationships may be the creation of a linear or non-linear equation or function that conforms to a time/temperature relationship or $I_{laser\ bias}$/temperature relationship of a given laser diode. In this case, a time or $I_{laser\ bias}$ value is input to a given equation or function to calculate a corresponding target temperature of the TEC 114.

And as noted above, a laser diode may be calibrated for operation within two or more channels. The characterization of a laser diode may, therefore, be extended to account for two or more channels. It is possible that the wavelength drift of a laser diode may be different for each channel. FIG. 12B illustrates an exemplary lookup table 1210 that is similar to the first lookup table 1200, but extended to include data for a second channel.

In a first embodiment of the present invention, the target wavelength for a given ITU channel is offset above or below the channel center 10 to account for expected wavelength drift over time. If a blue shift is expected, the target wave length may be set above the channel center 10. Conversely, if a red shift is expected, the target wavelength may be set below the channel center 10. This allows for a greater amount of wavelength drift than would be possible if the target wavelength were set to the channel center.

Figure 1:
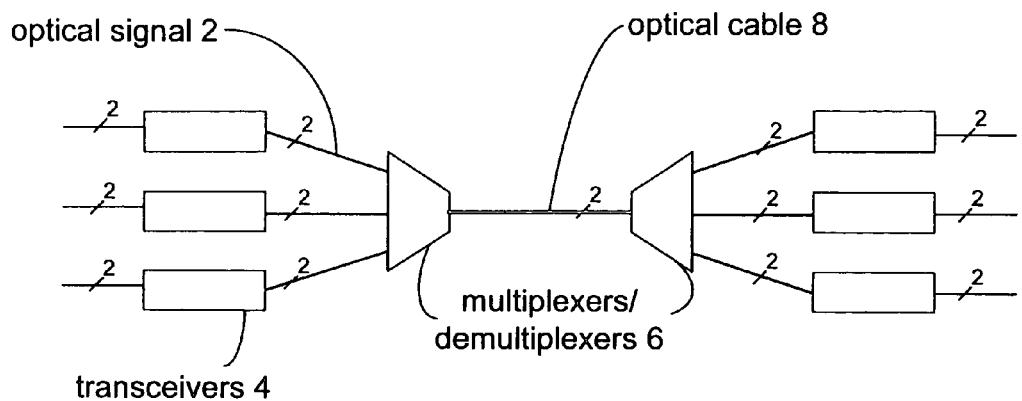
FIG. 1 is a schematic representation of a multi-channel optical network.
Figure 2:
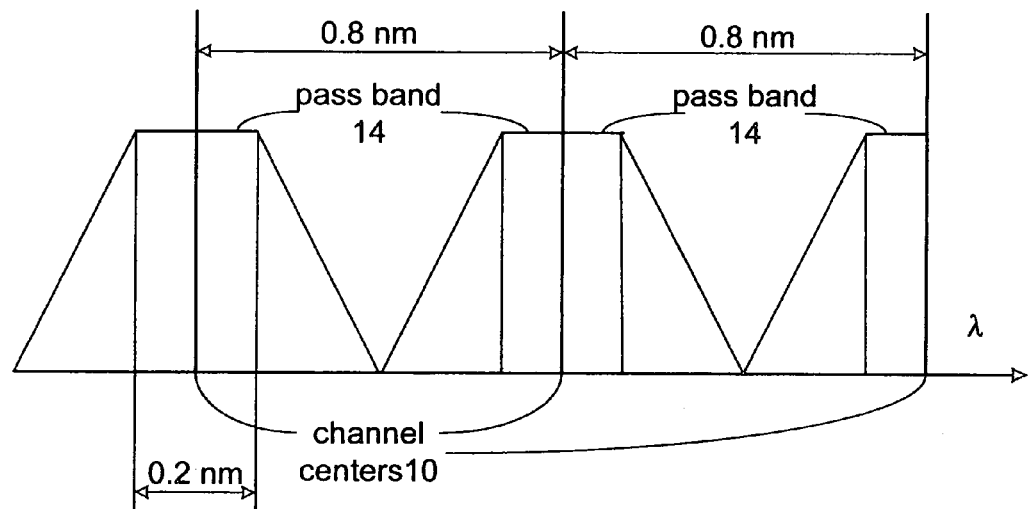
FIG. 2 is a schematic representation of wavelengths in a multi-channel 100 GHz standard.
Figure 3:
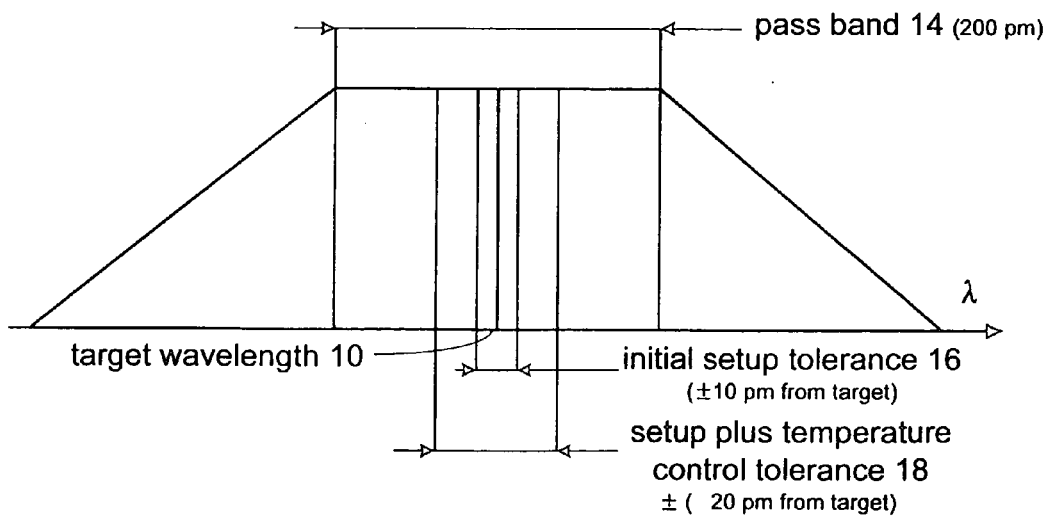
FIG. 3 is a schematic representation of a laser emitter, pass band calculation.

For example, if by reference to the first and second relationships, it is determined that a given laser diode will experience a blue shift of 90 pm (i.e., a "90 pm blue shift") during its useful life (or its defined operational lifetime, such as 20 or 25 years), the target wavelength is set to a wavelength higher than the channel center 10. With respect to FIG. 3, it is stated above that 30 pm of tolerance is required for the initial setup and temperature control such that 70 pm of wavelength drift from the channel center 10 in either direction is possible without breaching a 200 pm channel. Without the use of the present invention, therefore, this particular laser diode could not previously be used to operate within a 200 pm channel (without the use of, for example, a wavelocker) since the expected 90 pm blue shift exceeds the 70 pm of allowable drift from the channel center 10.

Figure 13A:
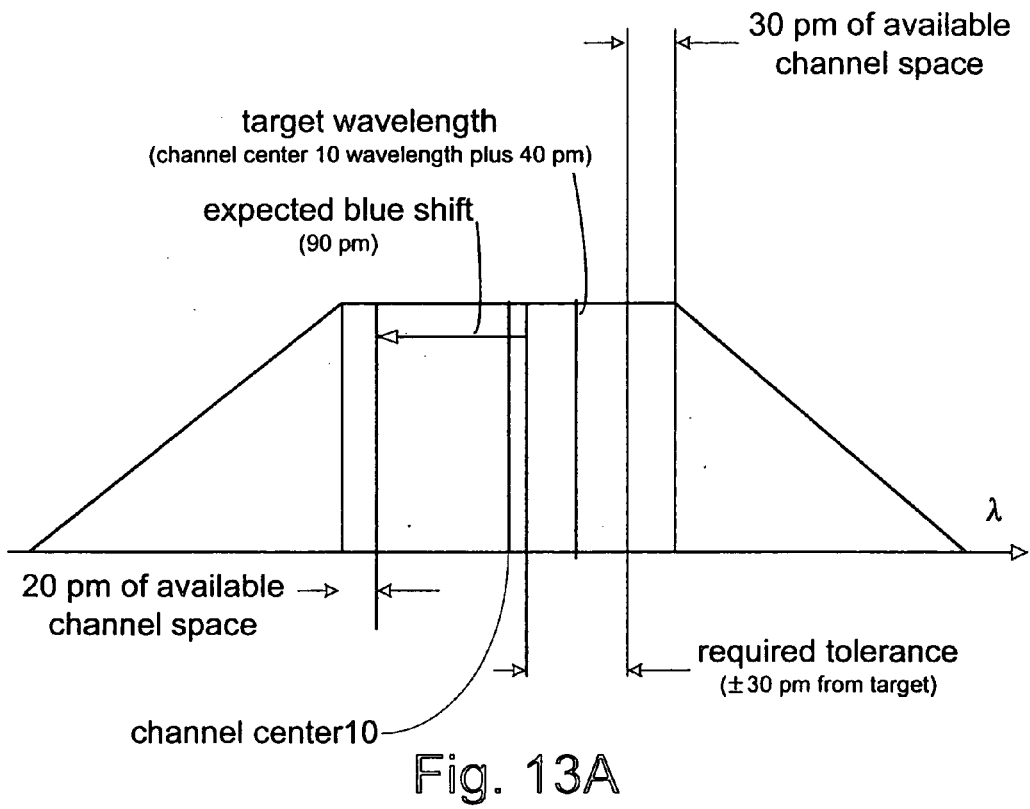
FIGS. 13A and 13B illustrate target wavelength adjustments.

To compensate, the target wavelength for this channel and this particular laser diode is set, for example, 40 pm above the channel center 10 (i.e., set to the channel center 10 wavelength plus a 40 pm offset). First, the 40 pm offset plus the 30 pm of required tolerance does not exceed the 100 pm of channel space above the channel center 10 (i.e., there is 30 pm of available channel space above the target wavelength even when allowing for the 30 pm of required tolerance). Second, by offsetting the expected 90 pm blue shift by the 40 pm offset, the wavelength of the exemplary laser diode will drift to approximately 50 pm below the channel center 10 wavelength during its useful life. Adding the 30 pm of required tolerance to this expected 50 pm shift below the channel center 10 produces a possible blue shift below the channel center 10 of up to 80 pm, which is within the 100 pm of channel space below the channel center 10 (i.e., there is 20 pm of available channel space). The offset of the target wavelength in this example is illustrated in FIG. 13A.

Figure 13B:
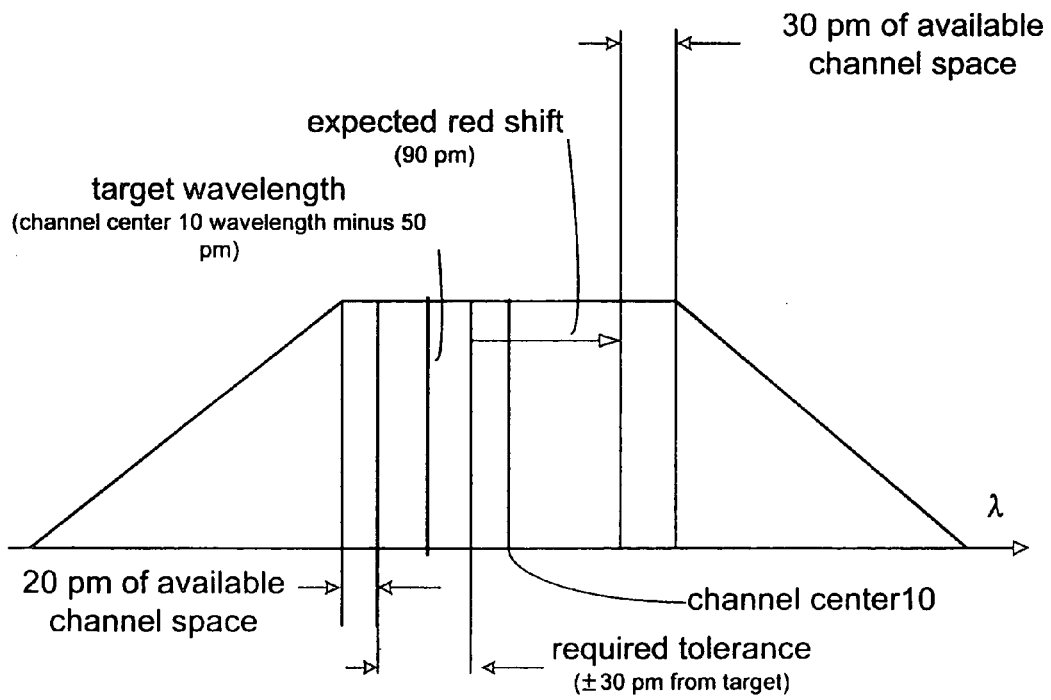

FIG. 13B illustrates another example in which it is determined that a given laser diode will experience a red shift of 90 pm (i.e., a "90 pm red shift") during its useful life. To compensate, the target wavelength is set below a channel center 10 wavelength. Again, it is stated above with respect to FIG. 3 that 30 pm of tolerance is required for the initial setup and temperature control such that 70 pm of wavelength drift from the channel center 10 in either direction is possible without breaching a 200 pm channel. Without the use of the present invention (or, for example, a wavelocker), therefore, this particular laser diode could not previously be used to operate within a 200 pm channel since the expected 90 pm red shift exceeds the 70 pm of allowable drift from the channel center 10.

To compensate, the target wavelength for this channel and this particular laser diode is set, for example, 50 pm below the channel center 10 (i.e., set to the channel center 10 wavelength minus a 50 pm offset). First, the 50 pm offset plus the 30 pm of required tolerance does not exceed the 100 pm of channel space below the channel center 10 (i.e., there is 20 pm of available channel space below the target wavelength even when allowing for the 30 pm of required tolerance). Second, by offsetting the expected 90 pm red shift by the 50 pm offset, the wavelength of the exemplary laser diode will drift to approximately 40 pm above the channel center 10 wavelength during its useful life. Adding the 30 pm of required tolerance to this expected 40 pm shift above the channel center 10 produces a possible red shift above the channel center 10 of up to 70 pm, which is within the 100 pm of channel space above the channel center 10 (i.e., there is 30 pm of available channel space).

The embodiments of the present invention described above in connection with FIGS. 13A and 13B may be used to select a target wavelength as indicated. This target wavelength may then be used in connection with the processing steps described above in connection with FIG. 9 to calculate initial values for temperature and $I_{laser\ bias}$. In a preferred embodiment, the target wavelength is offset from the channel center wavelength by a wavelength offset of at least 30 pm and less than 70 pm. In other embodiments, the target wavelength is offset from the channel center wavelength by a wavelength offset of at least 40 pm and less than 80 pm. In yet another embodiment the target wavelength is offset from the channel center wavelength by a wavelength offset of at least 50 pm. Further, in the preferred embodiment, the wavelength control tolerance (described above with reference to FIG. 3) is about 30 pm, but in other embodiments, the wavelength control tolerance may be as small as 10 pm or as large as 35 pm.

Figure 14A:
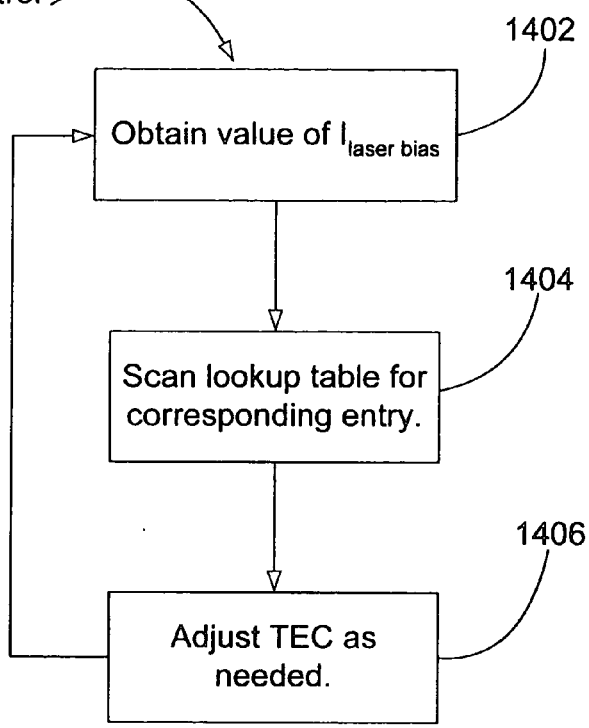
FIGS. 14A and 14B illustrate processing steps for adjusting a target temperature for a laser.

Turning to another embodiment, FIG. 14A illustrates a temperature control flowchart 1400. Briefly, this flowchart illustrates a process in which the microprocessor 200 polls $I_{laser\ bias}$ to obtain an index into, for example, the wavelength drift lookup table 1200 and adjust target temperature of the TEC 114 accordingly. This embodiment—and other embodiments described below—may be used after executing the processing steps described above in connection with FIG. 9 to compensate for a predicted wavelength drift (e.g., to adjust the temperature value(s) stored in one or more executions of step 918).

In a first step, the microprocessor 200 obtains the value of $I_{laser\ bias}$ (step 1402). As described above, the laser driver supplies a voltage $V(I_{laser\ bias})$ that is proportional to $I_{laser\ bias}$ to the microprocessor 200. The microprocessor 200 may, therefore, use this voltage to calculate the current value of $I_{laser\ bias}$. Alternatively, the wavelength drift lookup table 1200 is indexed by values of $V(I_{laser\ bias})$ instead of $I_{laser\ bias}$ to eliminate the need for the microprocessor to calculate $I_{laser\ bias}$ from $V(I_{laser\ bias})$.

The microprocessor 200 then scans a lookup table (e.g., wavelength drift lookup table 1200) to locate a corresponding entry (step 1404). As described above, the corresponding entry may be the entry with an exact match of the current value of $I_{laser\ bias}$, the entry that includes the closest match of the current value of $I_{laser\ bias}$, or a set of entries that enable the interpolation of a target temperature as described above.

Once the microprocessor 200 locates a corresponding entry (or set of entries) and extracts or calculates a target temperature of the TEC 114 from that entry, the microprocessor 200 adjusts the target temperature of the TEC 114 (step 1406). This preferably includes the microprocessor 200 adjusting the value of the TEC Command signal such that the TEC 114 maintains the laser diode at the new target temperature until the target temperature of the TEC 114 is recalculated or otherwise reset.

The microprocessor 200 eventually returns to step 1402 to repeat the process. In some embodiments, the microprocessor 200 continuously monitors $I_{laser\ bias}$ and executes steps 1404 and 1406, as described above, each time an accumulated change in the value of $I_{laser\ bias}$ reaches a predefined percentage amount. For example, each time $I_{laser\ bias}$ changes by 1% since the last execution of step 1406 (since the beginning of the laser diode's operation), the microprocessor 200 executes steps 1404 and 1406. Alternately, steps 1404 and 1406 may be performed each time the laser diode is powered on, or each time the laser diode's internal cumulative operation counter increases by a predefined amount (e.g., a predefined number of hours of operation, such as or 512 hours, 1024 hours, or 50,000 hours of operation) which is preferably at least 500 hours and less than 100,000 hours.

Figure 14B:
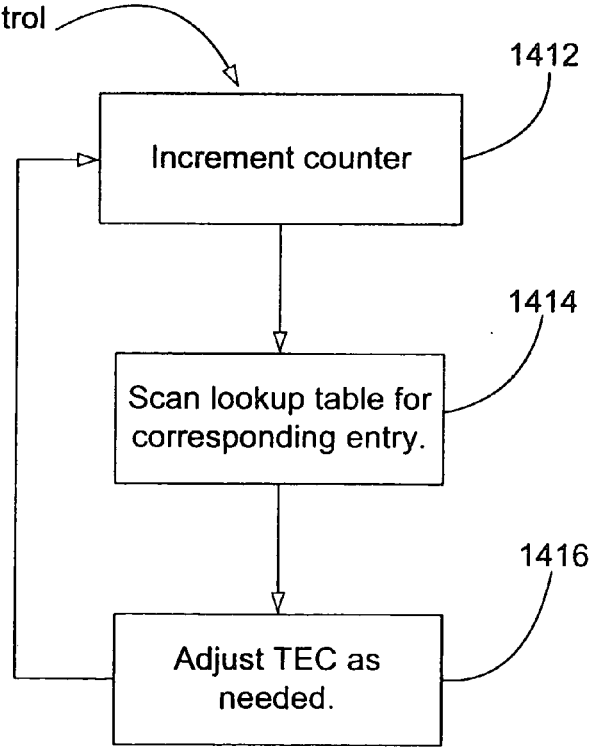

FIG. 14B illustrates a temperature control flowchart 1410 consistent with another embodiment of the present invention. Generally, this flowchart illustrates a process in which the microprocessor 200 recalculates the target temperature of the TEC 114 each time a predefined period of time passes.

In a first step, the microprocessor 200 increments a counter maintained in, for example, the EEPROM device 204 (step 1412). This step is only executed after the passage of a predefined period of time (e.g., 512 hours of operation, or more generally, a value between 500 and 100,000 hours). The microprocessor 200 then scans a lookup table (e.g., wavelength drift lookup table 1200) to locate an entry corresponding to the value of the counter incremented in step 1412 (step 1414). Once the microprocessor 200 locates a corresponding entry and extracts a target temperature of the TEC 114 from that entry, the microprocessor 200 adjusts the target temperature of the TEC 114 (step 1416). Like step 1406 above, this step preferably includes the microprocessor 200 adjusting the value of the TEC Command signal such that the TEC 114 maintains the laser diode at the new target temperature until step 1416 is re-executed. The microprocessor 200 then returns to step 1412 after the passage of the predefined period of time.

In other embodiments, the use of a target wavelength offset, as illustrated by FIGS. 12A and 12B, and periodic or intermittent adjustments of the target temperature of the TEC 114 are combined. This may be necessary, for example, if the microprocessor 200 and/or the TEC 114 cannot keep the wavelength of the laser diode within a given channel by means of target wavelength offset or the periodic or intermittent adjustments of the target temperature of the TEC 114 alone. In these embodiments, the target wavelength is set by reference to an estimated drift of the laser diode's wavelength (e.g., to set the target wavelength used in steps 901–918 described above) and then the target temperature of the TEC 114 is intermittently adjusted as described above.

One may observe when practicing aspects of the present invention that using sensor components to measure one or more of the previously-described variables prior to adjusting the TEC 114 may be present difficulties in some cases. For example, the bias current may change only by a minimal percentage amount over several days, months, and/or years. Ascertaining the actual percentage change in a given timeframe may be difficult for some transceiver module 100 users or manufactures that may wish to implement low cost, or low grade sensors.

Accordingly, additional embodiments are provided whereby a microprocessor 200 can use a clock function to automatically and/or iteratively adjust the transceiver 100 temperature through the TEC 114 as a function of time. In particular, such functionality is possible since a typical microprocessor 200 is capable of counting time with fairly reasonable precision. Applying this capability to at least one aspect of the described embodiments, microprocessor 200 can include or have access to a time counter module 220, wherein the microprocessor records multiple intervals of time, such as one or more seconds. Smaller or larger time sample intervals are also acceptable including fractions of a second, whole minutes, hours, days, weeks, months, and years, etc. Time counter module 220 can be any volatile or non-volatile memory that contains instructions for receiving, comparing, and computing various inputs.

The microprocessor 200 also can record or identify measured wavelength and/or wavelength shift with each measured time interval. For example, the sampled data can include different wavelength data points such as an average wavelength of an optical channel during a 5 minute timeframe, sampled once every week. Alternatively, the sampled data can include specific wavelength data points taken once every 2 months, once a year, and so on. Data from each sample time interval and wavelength measurement can be used immediately, or can be stored in a memory module of the microprocessor 200, or can be stored in a separate memory module such as an EEPROM 204.

In any such case, the microprocessor 200 can use the measured information to identify a differential wavelength value that represents wavelength differences between corresponding time measurements. The microprocessor 200 can then calculate an average wavelength drift per respective unit of time. The microprocessor 200 can use the calculated average wavelength drift to provide corresponding, intermittent adjustments in the TEC 114 that will help steer the drifting wavelength back toward the target wavelength. The TEC 114 adjustment can be performed as already described herein. For example, in some embodiments, the time counter module 220 includes computer executable instructions so that the module 220 can send output instructions in the form of a TEC command adjustment through to Digital to Analog Output Circuitry 210, where the circuitry 210 forward the TEC command output to TEC 114

Figure 15:
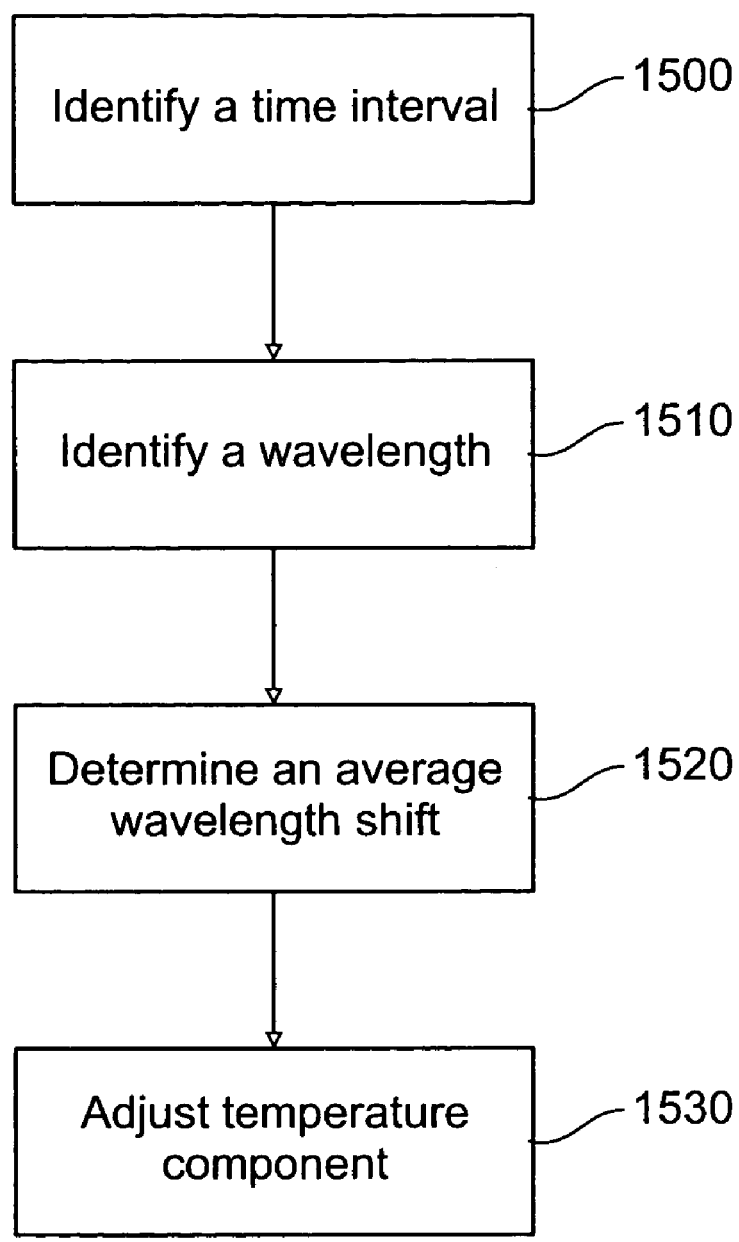
FIG. 15 is a flowchart illustrating one example method for compensating for wavelength drift in an optoelectronic assembly.

FIG. 15 represents one exemplary method that can be implemented in an optoelectronic assembly. As illustrated, a method for compensating for wavelength drift in an optoelectronic assembly can comprise an act 1500 of identifying a time interval. Act 1500 can include identifying two or more time intervals. For example, a time counter can record continuous time in seconds, minutes, days, months, etc. As well, the time counter can count but may only record events that occur every other time interval such as one event every month, year, and so forth.

The method also includes an act 1510 of identifying a wavelength. Act 1510 includes identifying a corresponding optical signal wavelength for each of the one or more time intervals. For example, a wave meter 802 can measure any optical signal passing through an optical subassembly, such as a transmitted optical signal passing out of a transmitter optical subassembly. The wave meter 802 can send the measured wavelength value to a computerize system 804, and/or send the wavelength value to the microprocessor 200, where it can be stored in the EEPROM 204, and/or the time counter module 220.

The method further includes an act 1520 of determining an average wavelength shift. Act 1520 can include calculating an average wavelength drift based at least in part on a differential wavelength value detected between the identified corresponding optical signal wavelengths over the identified two or more time intervals. For example, the microprocessor 200 can compare one wavelength value at a first time interval or moment with a second wavelength value measured at a second time interval or moment, and then divide the difference in wavelength values by the difference in time intervals or moments. Hence, the microprocessor 200 can detect an average wavelength shift over a specified period of time.

Finally, the method includes an act 1530 of adjusting a temperature component. Act 1530 includes an act of adjusting a temperature component in the optoelectronic assembly so that a transmitted optical signal has a resultant wavelength that is within an appropriate range of a target wavelength. For example, the microprocessor 200 can send out a TEC 114 control signal after a predetermined amount of time that changes the temperature of the relevant optical subassembly. In one embodiment, the microprocessor 200 sends out iterative TEC control signals to the TEC 114 until the optical signal wavelength that is transmitted from the transmitter optical subassembly is within an acceptable range of a target wavelength. As described herein, the acceptable range can be anywhere from 20 or so picometers to 100 picometers on either side of the target wavelength, depending on the nature of the average wavelength shift.

The foregoing descriptions of specific embodiments of the present invention are presented for purposes of illustration and description. The embodiments were chosen and described in order to best explain the principles of the invention and its practical applications, to thereby enable others skilled in the art to best utilize the invention. They are not intended to be exhaustive or to limit the invention to the precise forms disclosed. Various modifications may occur to those skilled in the art having the benefit of this disclosure without departing from the inventive concepts described herein. Accordingly, it is the claims, not merely the foregoing illustration, that are intended to define the exclusive rights of the invention.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A method of compensating for wavelength drift in an optoelectronic assembly comprising:
   identifying two or more time intervals;
   identifying a corresponding optical signal wavelength for each of the two or more time intervals;
   calculating an average wavelength drift based at least in part on a differential wavelength value detected between the identified corresponding optical signal wavelengths over the identified two or more time intervals; and
   adjusting a temperature component in the optoelectronic assembly so that a transmitted optical signal has a resultant wavelength that is within 100 picometers of a target wavelength.

2. The method as recited in claim 1, wherein the average wavelength drift of the optoelectronic assembly over the defined operational lifetime comprises one of a red shift and a blue shift.

3. The method as recited in claim 1, wherein the temperature component is a thermoelectric cooler.

4. The method as recited in claim 1, wherein the optoelectronic assembly is an optical transceiver including a transmitter optical sub-assembly.

5. The method as recited in claim 1, wherein the identified two or more time intervals sampled from at least one of a second, a minute, an hour, a day, a week, a month, and a year time frame.

6. The method as recited in claim 5, wherein data representing the identified two or more time intervals and the identified corresponding optical signal wavelength are stored in at least one of a volatile memory, and a non-volatile memory that is accessed by a microprocessor.

7. The method as recited in claim 6, wherein the wavelength data for the corresponding optical signal wavelengths are measured at a wave meter, the wave meter then forwarding the measured wavelength data to the microprocessor.

8. An optoelectronic assembly, comprising:
   one or more optical subassemblies;
   a thermoelectric cooler coupled with at least one of the one or more optical subassemblies; and
   a microprocessor having instructions that, when executed, perform the method comprising:
   identifying two or more time intervals;
   identifying a corresponding optical signal wavelength for each of the one or more time intervals;
   calculating an average wavelength drift based at least in part on a differential wavelength value detected between the identified corresponding optical signal wavelengths over the identified two or more time intervals; and
   adjusting the thermoelectric cooler in the optoelectronic assembly so that an optical signal passing through the at least one of the one or more optical subassemblies has a resultant wavelength that is within 100 picometers of a target wavelength.

9. The optoelectronic assembly as recited in claim 8, wherein the at least one of the one or more optical subassemblies comprises a transmitter optical subassembly.

10. The optoelectronic assembly as recited in claim 9, wherein the identified corresponding optical signal wavelength for each of the one or more time intervals is stored in the memory module.

11. The optoelectronic assembly as recited in claim 8, further comprising a memory module comprising one of a volatile memory, and a nonvolatile memory.

12. The optoelectronic assembly as recited in claim 8, further comprising a wave meter for measuring an optical signal wavelength that passes through the at least one of the one or more optical subassemblies.

13. The optoelectronic assembly as recited in claim 12, wherein the microprocessor identifies a corresponding optical signal wavelength for each of the one or more time intervals based on a signal received from the wave meter for measuring an optical signal.

14. A method for adjusting an output wavelength of an optical transceiver, the method comprising:
   identifying a first time interval for a laser included in an optical transceiver;
   identifying a first wavelength output by the laser during the first time interval;
   identifying a second time interval for the laser;
   identifying a second wavelength output by the laser during the second time interval
   determining an average wavelength shift using the first wavelength and the second wavelength over a period of time between the first time interval and the second time interval; and
   adjusting a temperature of the laser based on the average wavelength shift to adjust an output wavelength of the laser such that the output wavelength is within 100 picometers of a target wavelength.

15. A method as defined in claim 14, wherein identifying a first wavelength output by the laser during the first time interval further comprises obtaining sample data that includes a wavelength over the first time interval.

16. A method as defined in claim 14, wherein identifying a second wavelength output by the laser during the second time interval further comprises obtaining sample data that includes a wavelength over the second time interval.

17. A method as defined in claim 14, wherein the first time interval is a first specified period of time and wherein the second time interval is a second specified period of time.

18. A method as defined in claim 14, wherein adjusting a temperature of the laser based on the average wavelength shift further comprises accessing a control value to determine a particular temperature to which the laser is adjusted.

19. A method of compensating for wavelength drift in an optoelectronic assembly comprising:
   identifying two or more time intervals;
   identifying a corresponding optical signal wavelength of a transmitted optical signal for each of the two or more time intervals;
   calculating an average wavelength drift of the transmitted optical signal based at least in part on a differential wavelength value detected between the identified corresponding optical signal wavelengths over the identified two or more time intervals; and
   adjusting a temperature component in the optoelectronic assembly which is transmitting the transmitted optical signal so that the transmitted optical signal has a resultant wavelength that is within 100 picometers of target wavelength.

* * * * *

UNITED STATES PATENT AND TRADEMARK OFFICE
CERTIFICATE OF CORRECTION

PATENT NO. : 7,236,507 B2  Page 1 of 1
APPLICATION NO. : 10/783560
DATED : June 26, 2007
INVENTOR(S) : Stewart et al.

It is certified that error appears in the above-identified patent and that said Letters Patent is hereby corrected as shown below:

Column 4
Line 54, after "30", change "are" to --is--

Column 8
Line 12, change "FIG. 4" to --FIG. 6--
Line 27, change "AID" to --A/D--

Column 11
Line 1, change "904" to --804--

Column 13
Line 50, change "120" to --1200--
Line 54, change "120" to --1200--
Line 60, change "120" to --1200--

Column 20
Line 43, after "interval", insert --;--

Signed and Sealed this

Twenty-third Day of March, 2010

David J. Kappos
*Director of the United States Patent and Trademark Office*